Aug. 15, 1972 M. WILHELM ET AL 3,684,495

SUPERCONDUCTING ALLOY

Filed Aug. 3, 1970

United States Patent Office 3,684,495
Patented Aug. 15, 1972

3,684,495

SUPERCONDUCTING ALLOY

Manfred Wilhelm, Teutonenstr. 23, Nuremberg, Germany, and Bernhard Hillenbrand, Friedrich-Bauer-Str. 16, Erlangen, Germany Filed Aug. 3, 1970, Ser. No. 60,581
Claims priority, application Germany, Aug. 14, 1969, P 19 41 313.9
Int. Cl. C22c *5/00, 31/00*
U.S. Cl. 75—172 10 Claims

ABSTRACT OF THE DISCLOSURE

A superconducting alloy of the composition $$(Ce_{1.00-x}A_x)Ru_2$$

wherein "A" is Tb, Dy or Ho. For Tb $0.10 \leqslant x \leqslant 0.24$. For Dy $0.12 \leqslant x \leqslant 0.27$. For Ho $0.10 \leqslant x \leqslant 0.28$.

The invention relates to a superconducting alloy with the composition $(Ce_{1.00-x}A_x)Ru_2$.

U.S. Pat. 2,989,480, discloses an alloy of the composition $(Ce_{1.00-x}Gd_x)Ru_2$ which shown in the concentration range by $0.01 \leqslant x \leqslant 0.10$, at sufficiently low temperatures, superconducting and ferromagnetic behavior. This alloy may be considered a mixed crystal of the superconducting compound $CeRu_2$ and the ferromagnetic compound $GdRu_2$. Aside from this alloy, two other alloying systems with similar qualities have become known through U.S. Pat. 2,970,961 and the German published application 1,246,829, which have another composition but which also contain the rare earth element gadolinium. These compositions are the alloys $(Y_{1.00-x}Gd_x)Os_2$ wherein $0.01 \leqslant x \leqslant 0.10$ and $(Th_{0.925}Gd_{0.075})Ru_2$. The above sources indicate that the alloys be used as magnetic storage elements and a parametric amplifier with variable inductance.

It is the object of the invention to provide other alloys which, within a specific concentration range, at low temperature, show superconducting and ferromagnetic behavior and have advantages over the known alloys.

Thus we provide an alloy of composition $$(Ce_{1.00-x}A_x)Ru_2$$

wherein A is one of the elements Tb, Dy and Ho, while for Tb $0.10 \leqslant x \leqslant 0.24$, for Dy $0.12 \leqslant x \leqslant 0.27$ and for Ho $0.10 \leqslant x \leqslant 0.28$.

These alloys relate to mixed crystals of cubically crystallizing, superconducting compound $CeRu_2$ and the hexagonally crystallizing, ferromagnetic compounds $TbRu_2$, $DyRu_2$ and $HoRu_2$. In the indicated concentration ranges, the mixed crystals themselves possess a cubic crystal lattice whereby the cubic lattice parameter $a_0$ decreases with a reduced Ce-content. The fact that these alloys have, in the indicated concentration ranges at low temperatures, ferromagnetic as well as superconducting behavior, could not have been expected in any case and should be regarded as an exception. Tests have shown that mixed crystals of the superconducting compound $CeRu_2$ with the ferromagnetic compounds $PrRu_2$, $NdRu_2$ and $ErRu_2$ have no concentration ranges wherein both superconducting and ferromagnetic behavior are exhibited.

FIG. 1 shows for alloys of the formula $$(Ce_{0.80}Tb_{0.20})Ru_2$$

the curve of the critical temperature $T_C$ below which the alloys become superconductive and the curve of the Curie temperature $T_{Cu}$, below which the alloys exhibit ferromagnetic behavior with respect to the composition of the alloys.

with respect to the temperature.

Figure 5:
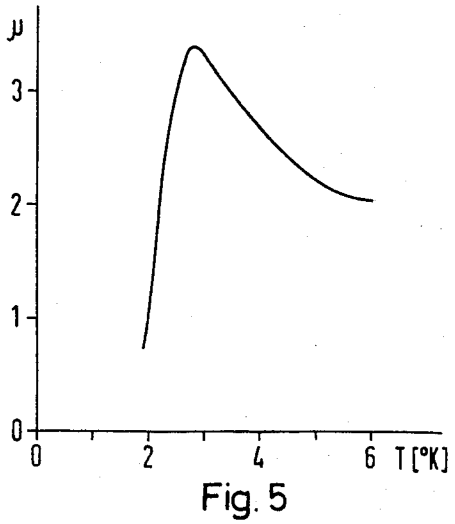

FIG. 5 shows the permability $\mu$ of the alloy $$(Ce_{0.78}Dy_{0.22})Ru_2$$

with respect to the temperature.

Figure 1:
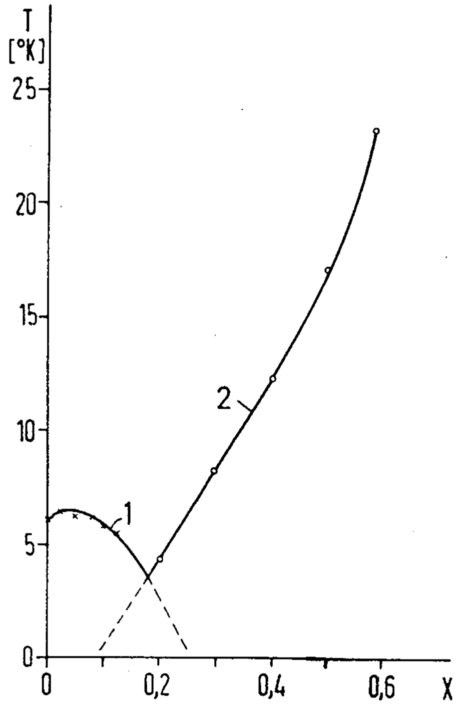

The invention will be described in greater detail with respect to the drawings:

In FIG. 1, the temperature is shown on the ordinate in ° K. and the values of $x$ in the formula $$(Ce_{1.00-x}Tb_x)Ru_2$$

are shown on the abscissa. 100 times $x$ corresponds to the share of the compound $TbRu_2$ of the alloy $$CeRu_2\text{-}TbRu_2$$

in mol-percent. The curve 1 indicates the critical temperature $T_C$, below which the alloys become superconductive. The curve 2 indicates the Curie temperature $T_{Cu}$, below which the alloys have a ferromagnetic behavior. The parts of curves 1 and 2, shown in broken lines, are extrapolated.

FIG. 1 shows plainly that the curves 1 and 2 intersect in a range (region) $0.10 \leqslant x \leqslant 0.24$. The intersection lies around $x=0.18$. The alloys whose composition lies within this range have superconducting as well as ferromagnetic behavior. It should be added that the alloys relate to type II superconductors with a lower critical magnetic field $H_{C1}$ and an upper critical magnetic field $H_{C2}$. An outer magnet field which is smaller than $H_{C1}$ is shielded from the alloy by currents at the surface of a specimen and cannot penetrate within the specimen. When the outer magnetic field exceeds the value $H_{C1}$ it may penetrate into the specimen, until upon reaching $H_{C2}$ the specimen is completely traversed by the magnetic field and loses its superconductivity. $H_{C1}$, in the alloys of the invention, reaches the order of magnitude of about 30 to 100 oersteds while $H_{C2}$ reaches the order of magnitude of several kilooersted.

Particularly preferred are the alloys of the composition $(Ce_{1.00-x}Tb_x)Ru_2$ within a range $0.12 \leqslant x \leqslant 0.23$, since they show the superconducting and ferromagnetic behavior, also at temperatures above 1° K. which can be obtained by evaporating normal, liquid helium, under reduced pressure, in a still relatively simple manner. The alloys with $0.10 \leqslant x < 0.18$ differ in their behavior from the alloys with $0.18 < x \leqslant 0.24$. The alloys with $$0.10 \leqslant x < 0.18$$

become, during a cooling down from a temperature above $T_C$ (critical temperature) to a temperature below $T_C$ first superconducting and during additional cooling to a temperature below $T_{Cu}$, a ferromagnetic behavior. This ferromagnetic behavior is virtually unnoticeable without an outside magnetic field or in outside magnetic fields which are smaller than $H_{C1}$, since such magnetic fields cannot penetrate the inside of the alloy and therefore have no effect upon the permeability of the alloy.

The alloys with $0.18 < x \leqslant 0.24$ become first ferromagnetic when cooled down from a temperature above $T_{Cu}$, to a temperature below $T_{Cu}$ and become superconductive during additional cooling to a temperature below $T_C$. Without an outer magnetic field or in outside magnetic fields which are smaller than $H_{C1}$, these alloys show in a superconducting state, a diamagnetic behavior since the outside magnetic field cannot penetrate the alloys.

Figure 4:
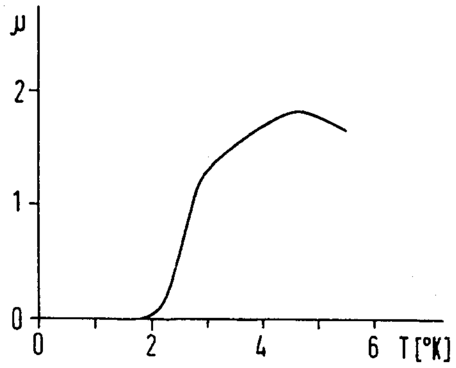
FIG. 4 shows the permeability $\mu$ of the alloy $$Ce_{0.80}Tb_{0.20})Ru_2$$

The behavior is visible for the alloy $(Ce_{0.80}Tb_{0.20})Ru_2$ from FIG. 4. The ordinate of this figure shows the permeability $\mu$, while the abscissa shows the temperature in ° K. This figure, at the same time, explains the determination of the temperatures $T_C$ and $T_{Cu}$ indicated in FIG. 1 by curves 1 and 2. These two temperatures are being determined magnetically, with the aid of the initial susceptability of the alloys. To this end an alloy specimen was first pulverized. The particle size in the powder was about 10 to 100$\mu$. The specimen was then placed into a coil and its inductivity changed was measured as a function of the temperature. The measuring frequency amounted to 860 Hz., the amplitude of the magnetic field amounted to several tenths Oersted. When the temperature is reduced, an inductivity maximum of the coil occurs first, i.e. a susceptibility maximum and permeability maximum of the specimen. This maximum indicates the Curie temperature $T_{Cu}$ which according to FIG. 4, is 4.5° K. for $(Ce_{0.80}Tb_{0.20})Ru_2$. When the temperature is lowered even more the inductivity in the coil decreases, whereby when the specimen transfers into the superconductive state, the decrease in inductivity happens very quickly. The critical temperature $T_C$ is that temperature at which half the transition takes place. In FIG. 4, this temperature is about 2.4° K. In a superconducting state, the permeability of the specimen equals zero, that is the specimen has diamagnetic behavior. The fact that the permeability in the vicinity of the Curie temperature has approximately only value 2, is due to the strong demagnetization of the pulverulent specimen. With appropriately formed compact bodies from the alloy, considerably higher permeabilities may be obtained. Magnetizing measurements of the specimens effected below Curie temperatures show saturation typical for ferromagnetism.

Figure 2:
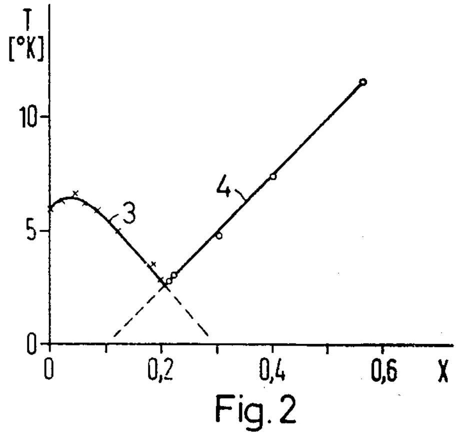
FIG. 2 shows the curve of $T_C$ and $T_{Cu}$ for the alloys of formula $(Ce_{1.00-x}Dy_x)Ru_2$ with respect to the composition.

In FIG. 2, in the same manner as in FIG. 1, there is shown the critical temperature $T_C$ (curve 3) and the Curie temperature $T_{Cu}$ (curve 4) for alloys of the composition $(Ce_{1.00-x}Dy_x)Ru_2$ with $x$ variable. FIG. 2 shows clearly that curves 3 and 4 intersect in the range $0.12 \leqslant x \leqslant 0.27$. The point of intersection is around $x=0.21$. The alloys whose composition is within that range, have both superconducting and ferromagnetic behavior. The alloys are particularly preferable in the range $0.15 \leqslant x \leqslant 0.25$ which show the same behavior at temperatures above 1° K. The alloys within $0.12 < x \leqslant 0.21$ and the alloys within $0.21 < x \leqslant 0.27$ show the same different behavior described in FIG. 1.

FIG. 5 shows, similarly to FIG. 4, illustrates as to the dependence of the permeability $\mu$ of the exemplary alloy $(Ce_{0.7}Dy_{0.22})Ru_2$ to temperature. The Curie temperature $T_{Cu}$ seen from FIG. 5, is approximately 2.8° K. Since the temperature for experimental reasons, could not be measured below 1.8° K., only one transfer of the test into the diamagnetic field could be obtained with $\mu$ smaller than 1, but not the complete diamagnetic state, with $\mu=0$. The critical temperature of the alloys, which can still be easily evaluated from FIG. 5, was about 2° K.

Figure 3:
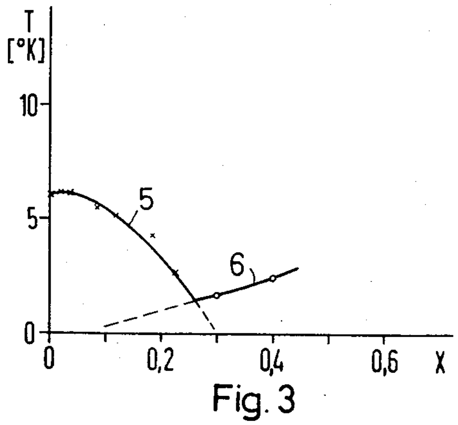
FIG. 3 shows the curve of $T_C$ and $T_{Cu}$ for the alloys of formula $(Ce_{1.00-x}Ho_x)Ru_2$ with respect to the composition.

FIG. 3 shows in the same manner of illustration as in FIG. 1, the critical temperature $T_C$ (curve 5) and the Curie temperature $T_{Cu}$ (curve 6) of alloys of the composition $(Ce_{1.00-x}HO_x)Ru_2$ with $x$ variable FIG. 3 shows plainly that curves 5 and 6 intersect in the range $0.10 \leqslant x \leqslant 0.28$. The point of intersection is at approximately $x=0.26$. The alloy compositions within this range show superconducting and ferromagnetic behavior. Particularly preferred are alloys $0.20 \leqslant x \leqslant 0.27$ which show the same behavior also above 1° K. The alloys with $0.10 \leqslant x < 0.26$ and the alloys with $0.26 < x \leqslant 0.28$ have the same different behavior which has already been explained in FIG. 1.

The following will explain in greater detail the production of the alloys according to the invention. All alloys may be produced fundamentally according to the same method. The starting materials are ruthenium (Ru) of a purity of 99.99% by weight in pulverulent form, terbium (Tb), dysprosium (Dy) and holmium (Ho) in bar form with a purity of 99.9% by weight. Cerium (Ce) which is first present in bar form with a conventional purity of 99.9% by weight was purified 20 times by zone melting at a speed of the melting zone of 0.5 mm./min. whereby the total content of metallic impurities was reduced to less than 100 p.p.m. The ruthenium powder was sintered into tablets for easier processing.

To produce the alloys according to the invention, appropriate amounts of cerium and terbium or dysprosium or holmium, respectively, were molten into a sphere, by inductive heating in a water-cooled copper boat using a protective gas pressure of 0.8 atm. argon. Subsequently the calculated amount of ruthenium was added and together with the two other elements, already alloyed, was remolten, also under argon, at least 3 more times. Following the triple remelting, the melt is heated to about 1800 to 2000° C. and then chilled by cooling. The chilling process was initiated by disconnecting the high frequency energy. After approximately 6 seconds, this results already in temperatures around 800° C. Subsequently, the specimen was annealed for about 15 minutes at 1330° C. Thereafter, the specimen is annealed for example on an $Al_2O_3$ base under a protective gas pressure of 0.8 atm. argon, for about 6 hours, up to homogenization, at a temperature of 1420° C .

The amounts of cerium, terbium or dysprosium or holmium and ruthenium, respectively, used for producing alloys of variable compositions, are shown in Tables I to III. The first column of the table indicates the respective composition of the produced alloys, the next three columns of the table indicate the initial material, in grams, used for producing these alloys.

TABLE I

| Alloy | Grams of— | | |
|---|---|---|---|
| | Ce | Tb | Ru |
| $(Ce_{.88}Tb_{0.12})Ru_2$ | 0.2861 | 0.0443 | 0.4690 |
| $(Ce_{.82}Tb_{0.18})Ru_2$ | 0.2834 | 0.0706 | 0.4986 |
| $(Ce_{.80}Tb_{0.20})Ru_2$ | 0.2812 | 0.0797 | 0.5071 |

TABLE II

| Alloy | Grams of— | | |
|---|---|---|---|
| | Ce | Dy | Ru |
| $(Ce_{0.88}Dy_{0.12})Ru_2$ | 0.2944 | 0.0466 | 0.4826 |
| $(Ce_{0.82}Dy_{0.18})Ru_2$ | 0.2895 | 0.0737 | 0.5093 |
| $(Ce_{0.80}Dy_{0.20})Ru_2$ | 0.2614 | 0.0758 | 0.4714 |
| $(Ce_{0.79}Dy_{0.21})Ru_2$ | 0.2840 | 0.0876 | 0.5186 |
| $(Ce_{0.78}Dy_{0.22})Ru_2$ | 0.2930 | 0.0958 | 0.5419 |
| $(Ce_{0.77}Dy_{0.23})Ru_2$ | 0.2853 | 0.0988 | 0.5345 |

TABLE III

| Alloy | Grams of— | | |
|---|---|---|---|
| | Ce | Ho | Ru |
| $(Ce_{0.88}Ho_{0.12})Ru_2$ | 0.2810 | 0.0451 | 0.4607 |
| $(Ce_{0.82}Ho_{0.18})Ru_2$ | 0.2738 | 0.0707 | 0.4817 |
| $(Ce_{0.78}Ho_{0.22})Ru_2$ | 0.2937 | 0.0975 | 0.5432 |
| $(Ce_{0.74}Ho_{0.26})Ru_2$ | 0.2500 | 0.1034 | 0.4874 |

The alloys produced according to the described method were homogeneous when examined under the microscope. The invention is not limited, however, to such microscopically homogeneous alloys, but also includes alloys which have a certain degree of non-homogeneity, due to crystal segregation, that is the so-called "zone mixed crystals." These result, for example, when the melt is chilled during the production of the alloys and not annealed up to homogeneity or if the homogeneity annealing does not last long enough, but lasts for example only one hour. For these microscopically non-homogeneous but microscopically homogeneous alloys, we obtain a gross composition from the formula of the form $(Ce_{1.00-x}A_x)Ru_2$ The $T_C$ and $T_{Cu}$ values of such microscopically non-homogeneous zone mixed crystals have been slightly changed with respect to values shown in FIGS. 1 to 3, however, the preferred characteristics of the alloys are hardly impaired thereby.

The alloys of the present invention are important for various technical applications. In addition to the already indicated usages, they can be advantageously utilized for changing the inductivity of a coil. Particularly suited for changing the inductivity of a coil, in dependence on the temperature are the alloys of the following compositions:

$(Ce_{1.00-x}Tb_x)Ru_2$ with $0.18<x\leqslant0.24$, preferably $$0.18<x\leqslant0.23$$

$(Ce_{1.00-x}Dy_x)Ru_2$ with $0.21<x\leqslant0.27$, preferably $$0.21<x\leqslant0.25$$

and $(Ce_{1.00-x}Ho_x)Ru_2$ with $0.26<x\leqslant0.28$, preferably $$0.26<x\leqslant0.27$$

In the preferred composition ranges, the preferable characteristics of the alloys, can also be utilized at temperatures above 1° K. The utilization of these alloys for controlling inductivity of a coil in dependence on the temperature will be discussed in greater detail as follows:

The coil whose inductivity is to be controlled is placed as tightly as possible around a body of the alloy, for example wound about a cylindrical body of the alloy. If the magnetic fields acting upon the body are less than $H_{C1}$ the body will be diamagentic at a temperature T below the critical temperature $T_C$, with $\mu=0$. The coil wound around the body is therefore not traversed by a magnetic flux and thus has an inductivity 0. If the temperature T is increased to a value above the critical temperature $T_C$, but below the Curie temperature $T_{Cu}$, then the body transfers from a superconducting into a normal conducting state. Its high ferromagnetic permeability which becomes effective thereby results in a considerable increase in the inductivity of the coil. An alloy of the composition $(Ce_{0.80}Tb_{0.20})Ru_2$ may be favorably employed, as seen from FIG. 1, when the inductivity of a coil may be controlled between a starting temperature below 2° K. and a final temperature of about 4.2° K. The alloy $(Ce_{0.78}Dy_{0.22})Ru_2$ is suitable, as shown by FIG. 2, for controlling the inductivity, for example ranging between an intial temperature below 2° K. and a final temperature of 2.6° K. The alloy $$(Ce_{0.73}Ho_{0.27})Ru_2$$

is suitable, as shown in FIG. 3, for example, for controlling the inductivity between an initial temperature of 1° K. and below and a final temperature of about 1.2° K. The selection of the alloys is preferably such that the final temperature is as close as possible to the Curie temperature. As FIGS. 4 and 5 show, the ferromagnetic permeability is at a maximum in the vicinity of the Curie temperature.

The alloys according to the invention expand the selection possibilities considerably over the heretofore known gadolinium containing alloys. Also relative to the known gadolinium containing alloys, the alloys according to the invention have that advantage, that a higher magentic moment per volume unit and thus a higher ferromagnetic permeability is obtainable due to the greater concentration of magnetic alloy components and due to the higher magnetic moments of the magnetic ions Tb, Dy and Ho.

Coils whose inductivity is controllable in dependence on the temperature may be used in circuits at low temperatures for control and regulating purposes. In circuits which are traversed by low alternating currents, they may be used as switches, for example due to their strong throttle effect which occur during temperature rises.

The inductivity of a coil which encloses a body of an alloy according to the invention may not only be controlled in dependence on the temperature but may also be controlled at a constant temperature, in dependence on an outer magnetic field. To this end, the alloys of the present invention are suitable within their entire composition range, i.e. alloys where $T_C$ is smaller than $T_{Cu}$ and alloys where $T_C$ is larger than $T_{Cu}$. Alloys whose $T_C$ is smaller than $T_{Cu}$ may be transferred into a normal conducting state by means of an outside magentic field at a temperature below $T_C$. While they are diamagnetic in a superconducting state, their permeability becomes effective in a normal conducting state. Alloys whose $T_{Cu}$ is smaller than $T_C$, are superconductive and completely diamagnetic at temperatures below $T_{Cu}$ in field that are smaller than $H_{C1}$. If an outer magnetic field exceed the value $H_{C1}$ it can penetrate the alloy. In the regions of the alloy that were penetrated by the magnetic field a ferromagnetic permeability then becomes effective. Coils whose inductivity is magnetically controllable in this manner may be used for control and regulating purposes in circuits which are kept at low temperatures. The afore-indicated advantages of the alloys of the invention over the known gadolinium containing alloys are also effective here.

We claim:

1. A superconducting alloy of the composition $(Ce_{1.00-x}A_x)Ru_2$ wherein "A" is an element selected from Tb, Dy and Ho; for Tb $0.10\leqslant x\leqslant0.24$; for Dy $0.12\leqslant x\leqslant0.27$; and for Ho $0.10\leqslant x\leqslant0.28$.

2. The superconducting alloy of claim 1 which is $(Ce_{1.00-x}Tb_x)Ru_2$ with $0.12\leqslant x\leqslant0.23$.

3. The superconducting alloy of claim 1 which is $(Ce_{1.00-x}Dy_x)Ru_2$ with $0.15\leqslant x\leqslant0.25$.

4. The superconducting alloy of claim 1 which is $(Ce_{1.00-x}Ho_x)Ru_2$ with $0.20\leqslant x\leqslant0.27$.

5. The superconducting alloy of claim 1 which is $(Ce_{1.00-x}Tb_x)Ru_2$ with $0.18<x\leqslant0.24$.

6. The superconducting alloy of claim 5 wherein $0.18<x\leqslant0.23$.

7. The superconducting alloy of claim 1 which is $(Ce_{1.00-x}Dy_x)Ru_2$ with $0.21<x\leqslant0.27$.

8. The superconducting alloy of claim 7 wherein $0.21<x\leqslant0.25$.

9. The superconducting alloy of claim 1 which is $(Ce_{1.00-x}Ho_x)Ru_2$ with $0.26<x\leqslant0.28$.

10. The superconducting alloy of claim 9 wherein $0.26<x\leqslant0.27$.

References Cited

UNITED STATES PATENTS

| | | | |
|---|---|---|---|
| 2,970,961 | 2/1961 | Matthias | 75—172 |
| 2,989,480 | 6/1961 | Matthias | 75—172 |
| 3,326,637 | 6/1967 | Holzberg et al. | 75—152 X |

L. DEWAYNE RUTLEDGE, Primary Examiner

E. L. WEISE, Assistant Examiner

U.S. Cl. X.R.

75—152; 23—204